Feb. 22, 1966 J. M. BUDD, JR 3,237,125
FREQUENCY STABILIZED SATURABLE CORE OSCILLATOR
Filed Nov. 14, 1962 2 Sheets-Sheet 1

INVENTOR.
JOHN M. BUDD, JR.
BY
Omund R. Dahle
ATTORNEY

Feb. 22, 1966 J. M. BUDD, JR 3,237,125

FREQUENCY STABILIZED SATURABLE CORE OSCILLATOR

Filed Nov. 14, 1962 2 Sheets-Sheet 2

INVENTOR.
JOHN M. BUDD, JR.
BY
Omund R. Dahle
ATTORNEY

United States Patent Office 3,237,125

Patented Feb. 22, 1966

3,237,125

FREQUENCY STABILIZED SATURABLE CORE OSCILLATOR

John M. Budd, Jr., Wayzata, Minn., assignor to Honeywell Inc., a corporation of Delaware Filed Nov. 14, 1962, Ser. No. 237,477

6 Claims. (Cl. 331—113)

This invention relates to a precision low frequency oscillator and more specifically to a novel transistor-magnetic core oscillator for use with a timer.

The oscillator to be described in detail below involves a unique circuit which couples a transistor bistable bridge type switching arrangement and a frequency controlling saturable core timing toroid element.

An object of this invention is to provide an improved precision low frequency oscillator which is highly reliable, accurate and rugged.

A more specific object of this invention is to provide an improved semiconductor type bistable bridge type circuit intercoupled with a saturable core timing toroid to provide a perfect precision low frequency oscillator.

A still further object of this invention is to provide an improved precision low frequency oscillator which has an improved switching action and which exhibits improved performance over a wide temperature range.

These and other objects of the invention will be more apparent upon a consideration of the specification, claims and drawing of which—

Figures 1, 1A:
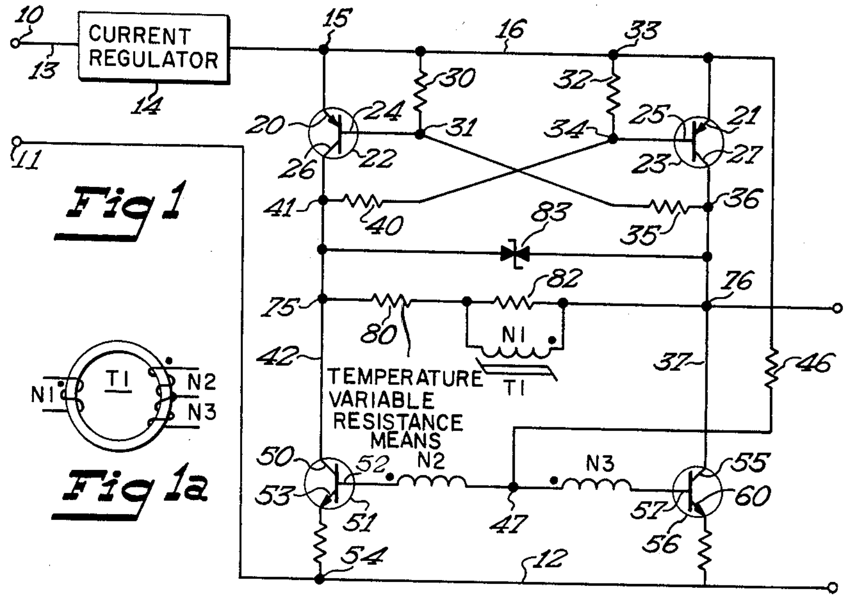
Figures 2, 2A:
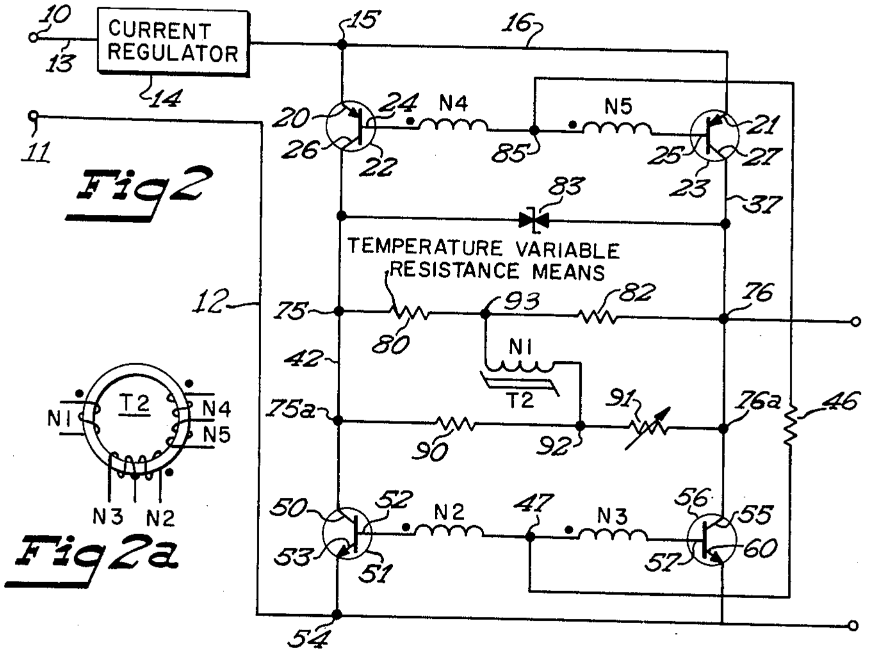
Figure 3:
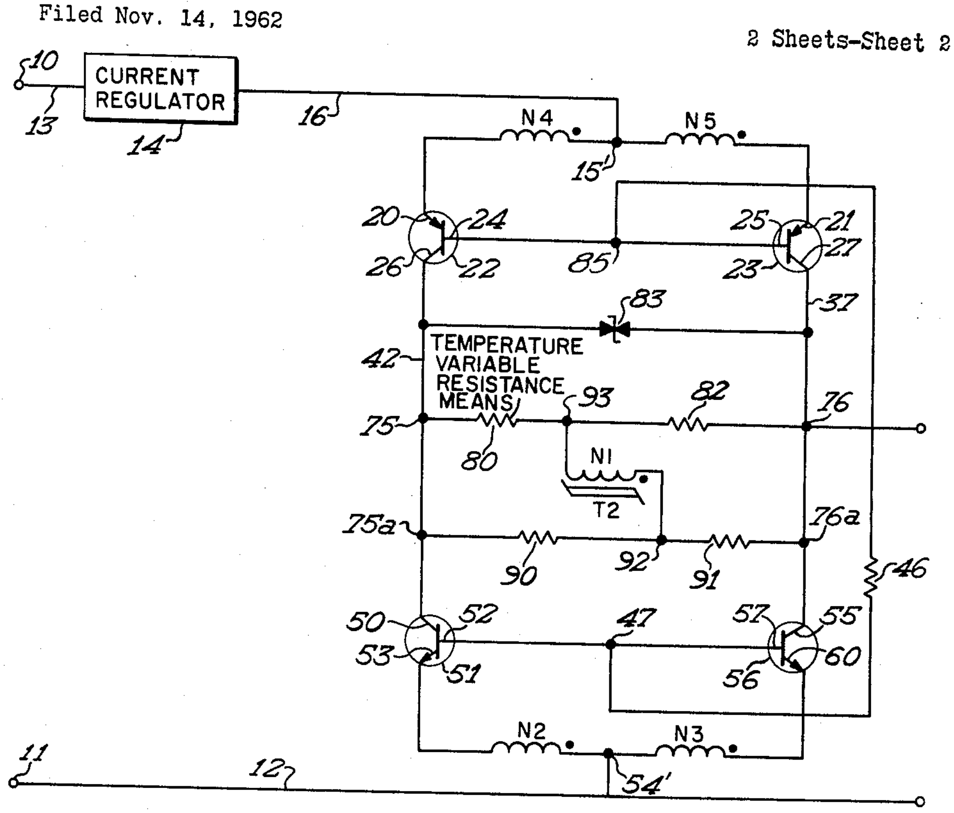

FIGURE 1 is a schematic representation of the circuit of one embodiment of this invention;

FIGURE 1*a* shows diagrammatically the saturable toroid utilized in FIGURE 1;

FIGURE 2 is a schematic representation of the circuit of another embodiment of the invention;

FIGURE 2*a* shows diagrammatically the saturable toroid utilized in FIGURE 2; and FIGURE 3 is a modification of FIGURE 2.

Referring now to FIGURE 1, a pair of input terminals 10 and 11 are connected across a suitable source of direct current potential, terminal 10 being positive with respect to terminal 11. Terminal 11 is connected to a common negative lead 12 and the positive terminal 10 is connected by a conductor 13 and a current regulator 14 which provides a constant current output and which may be a conventional semiconductor current regulator or which in its simplest form may be a current limiting resistor, to a junction 15 on a conductor 16.

Conductor 16 is directly connected to a pair of emitter electrodes 20 and 21 of a pair of semiconductor current control devices 22 and 23, which are herein disclosed as being pnp type transistors. Transistors 22 and 23 also include, respectively, base electrodes 24 and 25 and collector electrodes 26 and 27. A biasing resistor 30 is connected between the conductor 16 and a junction 31, which junction 31 is directly connected to the base electrode 24. Similarly, a resistor 32 is connected from a junction 33 on the conductor 16 to a junction 34, which junction 34 is directly connected to the base electrode 25. Base electrode 24 is also cross-coupled to the collector electrode 27 of transistor 23 through a path which includes the junction 31, a cross-coupling resistor 35, and a junction 36 on a conductor 37, which conductor is directly connected to the collector 27. The base electrode 25 of transistor 23 is similarly cross-coupled to the collector electrode 26 of transistor 22 through a path which may be traced from the base electrode 25 and the junction 34 through a cross-coupling resistor 40 and a junction 41 on a conductor 42, which conductor 42 is directly connected to the collector electrode 26. The transistors 22 and 23 and the associated components described above form a first bistable switching circuit.

The second bistable circuit of this FIGURE 1 is dissimilar in several respects from the above described bistable circuit and will be considered below. The conductor 42 is directly connected to a collector electrode 50 of an npn transistor 51. Transistor 51 also includes a base electrode 52 and an emitter electrode 53, the emitter electrode being connected through a small biasing resistor to a junction 54 on the negative conductor 12. The conductor 37 is directly connected to a collector electrode 55 of an npn transistor 56, which transistor 56 also includes a base electrode 57 and an emitter electrode 60. The emitter electrode 60 is connected through a small biasing resistor to the negative conductor 12. A base current path for the transistors 51 and 56 may be traced from the conductor 16 through a current limiting resistor 46, a junction 47, and a secondary winding N2 of a saturable core toroidal transformer T1 to the base electrode 52. A further path may be traced from the junction 47 through a further secondary winding N3 of the saturable transformer T1 to the base electrode 57 of transistor 56. FIGURE 1*a* shows diagrammatically the saturable timing toroid T1 which comprises a primary winding N1 in addition to the secondary windings N2 and N3. The saturating toroid has a core material having a substantially rectangular hysteresis loop.

The above described circuit is in effect two bistable circuits arranged to form a bridge type network. A pair of terminals 75 and 76 on the conductors 42 and 37 may be considered as the midpoints of the bridge network. Connected across these midpoints from junction 75 there may be traced a temperature compensating frequency controlling resistor 80 and the primary winding N1 of the saturating transformer T1 to the junction 76. Connected in parallel with the winding N1 is another frequency stabilizing resistor 82. A voltage reference diode 83 is also connected across the midpoints of the bridge in parallel with the network of elements 80, 82, and N1. Thus a voltage reference diode 83 may take the form of a double anode zener diode or other suitable voltage reference. The output circuit for the oscillator may be taken between junctions 76 and 54.

In considering the operation of the circuit, the pnp transistors 22 and 23 form the first bistable circuit and the npn transistors 51 and 56 together with their associated components form the second bistable circuit. The transistors are rendered conductive in pairs, that is pnp transistor 22 and npn transistor 56 will be "on" or conductive when transistors 23 and 51 are "off" and vice versa. The voltage divider across the bridge network comprising resistors 80 and 82, the saturable toroid T1 and the voltage reference 83 comprise the load for the bistable bridge circuit. A constant current is supplied through current regulator 14.

With transistors 22 and 56 conductive, the junction 75 is positive with respect to the junction 76, the magnitude of voltage between these junctions being closely controlled or regulated by the zener reference diode 83. The stabilization of the voltage by the zener diode 83 applies a controlled voltage across the toroid primary winding N1 through the compensation network comprising elements 80 and 82. As is well known, the frequency of a magnetic oscillator is represented by $F=E/4N\phi$ max. where E is voltage applied, N is the number of turns, and $\phi$ max. is the saturation flux of the magnetic material. The network comprising elements 80 and 82 are utilized to maintain the ratio $E/\phi$ max. constant over the temperature range of interest.

The voltage induced in the switching windings N2 and N3 are of such a polarity that the emitter to base junction of the off transistor 51 is back-biased. When the core of the saturable toroid T1 saturates to complete the first half cycle of oscillation the voltage between junctions 75 and 76 decreases, and the induced voltage in the windings N2 and N3 drops to zero removing the back-bias of the emitter to base junction on transistor 51 allowing the transistor to partially turn on. The total bias current of the transistors 51 and 56 is limited by the current limiting resistor 46 and as the transistor 51 begins to turn on, the previously conductive transistor 56 begins to turn off thus reducing the current flowing in the toroid N1. The inductive flyback action in the toroid T1 during switching turns the transistor 51 fully on and transistor 56 fully off. The bias potential for transistor 22 at junction 31 decreases causing the pnp transistor 22 to turn off and transistor 23 to turn on. As the toroid is removed from its state of saturation, the induced voltage in windings N2 and N3 back-biases the emitter to base junction of transistor 56 and maintains conductive the transistor 51. The pnp transistor 23 is maintained in the "on" state and transistor 22 is maintained in the "off" state until the saturable toroid T1 reaches saturation in the opposite direction at which time the first cycle is completed and the switching cycle is repeated causing the oscillator to free run.

The time base depends upon the volt-second integration of the magnetic core of timing toroid T1. This requires that a closely controlled voltage appear between the conductors 42 and 37 since the time is inversely proportional to the voltage applied across the winding N1, all other factors being constant. For this reason, the double anode zener voltage regulator 83 is connected across the conductors 42 and 37 to maintain this voltage constant during each half cycle of the operation of the circuit. When it is desired that the first and second half cycles be of equal time duration, the reference diode 83 should have symmetrical voltage characteristics in both directions. The frequency of oscillation may tend to shift due to temperature effects on the toroid T1 and therefore temperature compensating resistors 80 and 82 are utilized in circuit with winding N1.

Referring now to FIGURE 2, this circuit is similar in many respects to that of FIGURE 1 and like reference numerals are used for like components in the two figures. Initially, it will be noted that one main difference in FIGURE 2 is that switching windings are used in the base circuits of both the pnp and the npn transistors. In addition, the circuit connecting the primary winding N1 of the timing toroid T2 is modified from that in FIGURE 1.

Referring now more specifically to the circuit of FIGURE 2, the conductor 16 is directly connected to the emitter electrodes 20 and 21 of the transistors 22 and 23, with the base electrodes 24 and 25, respectively, being connected to secondary windings N4 and N5 of the saturable toroid T2. The opposite terminals of the windings N4 and N5 are connected together at a junction 85 and are further connected through the current limiting bias resistor 46 to the junction 47 and thence through the windings N2 and N3, respectively, to the base electrodes 52 and 57 of npn transistors 51 and 56. The resistor 46 provides current limiting to the base current for both the pnp and npn transistors.

As was mentioned above, the connections for the primary winding N1 of the timing toroid T2 differ from that disclosed in FIGURE 1. From the junction 75 on conductor 42 there is connected a first voltage divider comprising the temperature compensating resistor 80 and the frequency stabilizing resistor 82. These two resistors are connected in series with the far end of resistor 82 being connected to the junction 76 on conductor 37. A second voltage divider exists between junction 75*a* on the conductor 42 and junction 76*a* on the conductor 37 comprises a resistor 90 and a relatively small resistor 91. A junction 92 connects the resistors 90 and 91, and a junction 93 connects the resistors 80 and 82. The primary winding N1 of the timing toroid T2 is connected between the junctions 92 and 93.

In considering the operation of the circuit of FIGURE 2, the pnp transistors 22 and 23 form the first bistable circuit and the npn transistors 51 and 56 form the second bistable circuit. The polarities of the secondary biasing windings N2, N3, N4 and N5 are such that pnp transistor 22 and npn transistor 56 are rendered "on" or conductive when transistors 23 and 51 are biased "off" or nonconductive and vice versa. The resistors 80, 82, 90, 91, winding N1 and the voltage reference diode 83 comprise the load for the bistable bridge configuration.

Assuming transistors 22 and 56 are conductive, the junctions 75 and 75*a* are positive with respect to the junctions 76 and 76*a*, and the resulting votage across the primary winding N1 is in a direction to cause induced voltages on secondaries N4 and N3 to maintain these transistors conductive. The voltages induced on secondaries N2 and N5 are of a polarity to bias to cut off the transistors 23 and 51. When the toroidal core T1 saturates, the conducting transistors turn off and the inductive fly-back action in the toroid T1 during the switching period induces an opposite polarity on the secondary windings causing transistors 23 and 51 to turn "on." Junctions 76 and 76*a* now become positive with respect to junctions 75 and 75*a* reversing the polarity across the winding N1 and causing bias voltages on windings N4 and N3 to maintain nonconductive the transistors 22 and 56. The current path for the control circuit in this half cycle of operation may be traced from the conductor 16 to transistor 23, through the emitter-base junction thereof and winding N5 to junction 85, through current limiting resistor 46 to junction 47, and through the winding N2 and the base-emitter junction of transistor 51 to the negative conductor 12. The resistor 46 limits the current in the base circuit of both the pnp and npn transistor.

In the same manner as described for FIGURE 1, the zener voltage reference diode 83 maintains constant the voltage between the conductors 42 and 37 in order that a very closely controlled voltage is maintained on winding N1. The relatively small resistor 91, which is shown as being variable, provides a vernier frequency adjustment of the oscillator. The resistors 90 and 91 are preferably chosen to have equal temperature coefficients.

Turning now to FIGURE 3, the circuit disclosed is a modification of the apparatus of FIGURE 2. Rather than having the bias windings in the base electrode circuit, the bias windings N2, N3, N4 and N5 are placed in the emitter circuit of transistors 51, 56, 22 and 23, respectively. Thus, winding N4 is connected between junction 15' and emitter 20; winding N5 is connected between junction 15' and emitter 21; winding N2 is connected between junction 54' and emitter 53; and winding N3 is connected between junction 54' and emitter 60. The base electrodes 52 and 57 are directly connected together at the junction 47. The base electrodes 24 and 25 are directly connected together at the junction 85. The resistor 46 provides current limiting to the base electrode current for both the pnp and npn transistors.

The operation of the apparatus of FIGURE 3 is substantially identical to the operation of the circuit of FIGURE 2, described above. It will be appreciated that with the biasing windings N2, N3, N4 and N5 positioned in the emitter circuits, more current will flow in the biasing windings. For example, when transistors 23 and 51 are conductive, a current path from the current regulator 14 may be traced through conductor 16, winding N5, transistor 23, junctions 76 and 76*a*, through the network comprising resistive elements 82, 80, 91 and 90, winding N1 and zener diode 83 to conductor 42, and through transistor 51 and winding N2 to the negative terminal 11. It can be seen, therefore, that a larger current flows in the biasing windings than flows through the main winding N1. Obviously the number of turns used in the bias windings of FIGURE 3 may be different from the number of turns required in the circuit of FIGURE 2.

Modifications of this invention may occur to those who are skilled in the art and I therefore wish it to be understood that I intend to be limited solely by the scope of the appended claims and not by the specific embodiments described which are for the purpose of illustration of the invention.

I claim as my invention:

1. Low frequency oscillating timing apparatus comprising:

a source of electrical energy having first and second terminals;

first transistor bistable switching circuit means comprising first and second transistors energized from said first terminal of said source for providing current flow through one or the other of two current paths to third and fourth terminals, respectively, dependent upon the state of said bistable circuit;

second transistor bistable switching circuit means comprising third and fourth transistors connected intermediate said third and fourth terminals, respectively, and the second terminal of said source;

first voltage divider means comprising first and second resistive elements in series connected between said third and fourth terminals;

second voltage divider means comprising third and fourth resistive elements in series between said third and fourth terminals;

voltage regulator means connected between said third and fourth terminals;

saturable core timing means including a main winding thereon having first and second terminals connecting said timing means intermediate the common point of said first and second elements and the common point of said third and fourth elements and further including secondary winding means;

and feedback means comprising said further winding means responsive to saturation of said timing means connected to said bistable means for operating said bistable switching means to the opposite state of operation.

2. Low frequency oscillating timing apparatus comprising:

a source of electrical energy;

a bridge circuit having first, second, third and fourth points, a first transistor having a pair of output electrodes connected between said first and second points and further having a control electrode, a second transistor having a pair of output electrodes connected between said second and third points and further having a control electrode, a third transistor having a pair of output electrodes connected between said third and fourth points and further having a control electrode, and a fourth transistor hav- a pair of output electrodes connected between said fourth and first points and further having a control electrode, said bridge circuit forming a transistor bistable switching circuit energized from said source at said first and third points for providing current flow through one or the other of two current paths therein dependent upon the state of said bistable circuit;

first temperature compensating voltage divider means comprising first and second resistive elements connected in series between said second and fourth points;

second voltage divider means comprising third and fourth resistive elements connected in series between said second and fourth points;

saturable core timing means including a main winding thereon having first and second terminals connecting said timing means intermediate the common point of said first and second elements and the common point of said third and fourth elements, and including secondary winding means;

voltage regulator means connected between said second and fourth points for maintaining a controlled voltage to said saturable core timing means;

and means comprising said secondary winding means in said bistable means connected to said control electrodes of said transistors, said means being responsive to saturation of said timing means for operating said bistable switching means to the opposite state of operation.

3. Low frequency oscillating timing apparatus comprising:

a source of electrical energy;

a bridge circuit having first, second, third and fourth points, a first transistor having a pair of output electrodes connected between said first and second points and further having a control electrode, a second transistor having a pair of output electrodes connected between said second and third points and further having a control electrode, a third transistor having a pair of output electrodes connected between said third and fourth points and further having a control electrode, and a fourth transistor having a pair of output electrodes connected between said fourth and first points and further having a control electrode, said bridge circuit forming a transistor bistable switching circuit means energized from said source at said first and third points for providing current flow through one or the other of two current paths therein dependent upon the state of said bistable circuit;

temperature compensating voltage divider means comprising first and second resistive elements connected in series between said second and fourth points;

saturable core timing means including a main winding thereon having first and second terminals for connecting said timing means intermediate the common point of said first and second elements and said fourth point, and further including secondary winding means;

and feedback means comprising said secondary winding means connected to said control electrodes of said transistors in said bistable means and responsive to saturation of said timing means for operating said bistable switching means to the opposite state of operation.

4. Low frequency oscillator apparatus comprising:

a source of electrical energy;

first and second bistable semiconductor circuit means comprising first, second, third and fourth semiconductor current control means each having first and second output electrodes and a control electrode;

means connecting one terminal of said source to a first output electrode of said first and second semiconductor means;

means connecting a first output electrode of said third and fourth semiconductor means respectively, to the other terminal of said source;

first conductive means interconnecting the second output electrodes of said first and third semiconductor means;

second conductive means interconnecting the second output electrodes of said second and fourth semiconductor means;

first temperature compensating voltage divider means connected between said first and said second conductive means, said first divider means having an intermediate point thereon;

second voltage divider means connected between said first and said second conductive means, said second divider means having an intermediate point thereon;

saturable inductance means including main winding means and first, second, third and fourth further winding means, said main winding means having first and second terminals;

connection means connecting the first and second terminals of said saturable inductance means between said intermediate points on said first and second voltage divider means, respectively;

first bias means comprising said first and second further winding means coupled to said control electrodes of said first and second semiconductor means;

second bias means comprising said third and fourth further winding means coupled to said control electrodes of said third and fourth semiconductor means;

voltage regulator means;

and means connecting said voltage regulating means between said first and said second conductive means in parallel with said voltage divider means to regulate the voltage thereacross.

5. Low frequency oscillating timing apparatus comprising:

a source of electrical energy having first and second terminals;

first transistor bistable switching circuit means comprising first and second transistors energized from said first terminal of said source for providing current flow through one or the other of two current paths to third and fourth terminals, respectively, dependent upon the state of said bistable circuit;

second transistor bistable switching circuit means comprising third and fourth transistors connected intermediate said third and fourth terminals, respectively, and the second terminal of said source;

first voltage divider means connected between said third and fourth terminals, said first divider means comprising resistive means having an intermediate point thereon;

second voltage divider means connected between said third and fourth terminals, said second divider means comprising resistive means having an intermediate point thereon;

voltage regulator means connected between said third and fourth terminals;

saturable core timing means including a main winding thereon having first and second terminals connecting said timing means between said intermediate points on said first and second voltage divider means, and further including secondary winding means;

and feedback means comprising said secondary winding means responsive to saturation of said timing means connected to said bistable means for operating said bistable switching means to the opposite state of operation.

6. Low frequency magnetic oscillator apparatus comprising:

first and second input terminals for connection to opposite polarity terminals of a source of electrical energy;

first bistable means comprising first and second transistors each having base, emitter and collector electrodes;

saturable inductance means including a main winding having first and second terminals and also including first, second, third and fourth further winding means;

means connecting the emitter electrodes of said first and second transistors respectively through said first and second further winding means to said first input terminal;

second bistable means comprising third and fourth transistors each having base, emitter and collector electrodes;

means connecting the emitter electrodes of said third and fourth transistors respectively through said third and fourth further winding means to said second input terminal;

bias means connected to the base electrodes of each of said transistors; and means connecting the first terminal of the main winding of said saturable inductance means to the collector electrodes of first and third transistors and means connecting the second terminal of said main winding to the collector electrodes of second and fourth transistors.

References Cited by the Examiner

UNITED STATES PATENTS

| | | | |
|---|---|---|---|
| 3,029,398 | 4/1962 | McComb | 331—113 |
| 3,030,590 | 4/1962 | Fougere et al. | 331—113 |
| 3,038,127 | 6/1962 | Wofford N | 331—113 |
| 3,065,431 | 11/1962 | Geyger | 331—113 |
| 3,172,059 | 3/1965 | Freeborn | 331—113 |

OTHER REFERENCES

Mullard Technical Communications, "A Four-Transistor D.C. Converter Circuit for Use With Relatively High Voltage Supplies," No. 36, December 1958, pages 191, 192, TK 5101 M7.

ROY LAKE, *Primary Examiner.*

JOHN KOMINSKI, *Examiner.*